(12) United States Patent
Moon

(10) Patent No.: US 6,639,533 B2
(45) Date of Patent: Oct. 28, 2003

(54) DIGITAL TO ANALOG CONVERTER HAVING LOW POWER CONSUMPTION

(75) Inventor: Kyeong-tae Moon, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/961,828

(22) Filed: Sep. 24, 2001

(65) Prior Publication Data

US 2002/0097174 A1 Jul. 25, 2002

(30) Foreign Application Priority Data

Jan. 19, 2001 (KR) .......................................... 2001-3164

(51) Int. Cl.⁷ ................................................ H03M 1/66
(52) U.S. Cl. ...................................................... 341/144
(58) Field of Search ................................ 341/144, 138, 341/136

(56) References Cited

U.S. PATENT DOCUMENTS

| | | | | |
|---|---|---|---|---|
| 5,387,912 A | * | 2/1995 | Bowers | 341/118 |
| 5,706,006 A | * | 1/1998 | Hattori | 341/144 |
| 6,104,330 A | * | 8/2000 | Redman-White et al. | 341/150 |
| 6,160,507 A | * | 12/2000 | Carbou et al. | 341/144 |
| 6,225,929 B1 | * | 5/2001 | Beck | 341/144 |
| 6,236,347 B1 | * | 5/2001 | Cheng | 341/145 |
| 6,268,819 B1 | * | 7/2001 | Fattaruso et al. | 341/154 |
| 6,310,568 B1 | * | 10/2001 | Kurooka | 341/144 |

FOREIGN PATENT DOCUMENTS

KR    P1996-27359    7/1996    ............ H03M/1/12

* cited by examiner

*Primary Examiner*—Peguy Jeanpierre
(74) *Attorney, Agent, or Firm*—F. Chau & Associates, LLP

(57) ABSTRACT

A digital to analog converter having low power consumption is provided which includes a reference bias voltage generator for generating a predetermined bias voltage, and a conversion current generator having a plurality of current generators for supplying current which correspond to the bias voltage and a plurality of digital signals to an output terminal.

6 Claims, 3 Drawing Sheets

DIGITAL TO ANALOG CONVERTER HAVING LOW POWER CONSUMPTION

BACKGROUND OF THE INVENTION

1. Field of the Invention

The present invention relates to a converter for converting a digital signal to an analog signal, and more particularly, to a digital to analog converter having low power consumption.

2. Description of the Related Art

Digital information can be easily stored in storage medium such as RAM and ROM memories and processed by a personal computer, but numerous electronic devices cannot recognize digital information, such as a television (TV), a camcorder, and a digital camera. The digital information must be converted to an analog signal for processing in these devices.

FIG. 2 is a circuit diagram of an embodiment of a conventional digital to analog converter. Referring to FIG. 2, the conventional digital to analog converter includes a reference voltage generator 210 and a conversion current generator 220.

The reference voltage generator 210 generates voltages Vr1 and Vr2 to be used in the conversion current generator 220, and the conversion current generator 220 comprising a plurality of current cell matrices 221 through 223 generates conversion currents which correspond to digital signals D0 through DN.

A first current cell matrix 221 includes four MOS transistors M01 through M04 and an inverter IN0. The two MOS transistors M01 and M02 are connected in series from a power supply voltage Vdd and supply current in response to output voltages Vr1 and Vr2 of the reference voltage generator 210. The MOS transistor M03 driven by the digital signal D0 discharges the supplied current to a ground voltage GND, or the MOS transistor M04 driven by an output signal of the inverter IN0 for inversing the digital signal D0 supplies the supplied current to an output terminal lo.

A second current cell matrix 222 includes four MOS transistors M11 through M14 and an inverter IN1. As with the first current cell matrix 221, the four MOS transistors M11 through M14 supply current to the output terminal lo in response to the inverted signal of the digital signal D1, or discharges the current to the ground voltage GND in response to the digital signal D1.

An N+1-th (where N is an integer) current cell matrix 223 includes four MOS transistors MN1 through MN4 and an inverter INN. As with the first current cell matrix 221, the four MOS transistors MN1 through MN4 supply current to the output terminal lo in response to the inverted signal of the digital signal DN, or discharge the currents to GND in response to the digital signal DN.

As described above, in conventional digital to analog converters, even if digital signals are deactivated and there is no need for a current source, the current sources supply current continuously. In the conventional digital to analog converter shown in FIG. 2, unused current sources supply current continuously to ground GND. FIG. 3 is another conventional digital to analog converter shown in simplified schematic view. The unused current sources supply current to a closed loop. Thus, in the above conventional circuits, power is unnecessarily wasted in the form of current shunted to ground or in a closed loop.

SUMMARY OF THE INVENTION

To solve the above problems, it is an object of the present invention to provide a digital to analog converter for reducing power consumption.

Accordingly, to achieve the above object, there is provided a digital to analog converter. The digital to analog converter includes a reference bias voltage generator, and a conversion current generator. The reference bias voltage generator generates a predetermined bias voltage using a reference voltage. The conversion current generator comprises a plurality of current generators and supplies currents which correspond to the bias voltage and a plurality of digital signals to an output terminal. The current generators which correspond to activated digital signals of the plurality of digital signals among the plurality of current generators supply the corresponding currents to the output terminal, but the other current generators which correspond to deactivated digital signals of the plurality of digital signals do not supply currents to the output terminal.

It is preferable that each of the plurality of current generators comprises a controller for generating a control signal in response to the bias voltage and at least one signal of the plurality of digital signals, and a current source for supplying currents to the output terminal in response to the control signal.

It is also preferable that the controller comprises a control output terminal for outputting the control signal, an inverter for inverting the digital signal, a first MOS transistor, one end of which is connected to a power supply voltage, the other end of which is connected to the control output terminal, and the gate of which is connected to an output terminal of the inverter, and a second MOS transistor, one end of which is connected to the control output terminal, the other end of which is connected to the bias voltage, and the gate of which is connected to the digital signal.

It is also preferable that one end of the current source is connected to the power supply voltage, the other end of the current source is connected to the output terminal, and the gate of the current source is connected to the control output terminal of the controller.

In order to control the amount of the current supplied to the output terminal, it is preferable that the ratio W/L of the channel width and channel length of each of the third MOS transistors comprising the current source is designed to vary according to a predetermined rule.

According to another aspect of the invention, a digital to analog converter is provided, comprising a bias voltage generator for generating a bias voltage and a current generator having a plurality of current sources for providing current to an output node, each of the current sources being connected to the bias voltage generator and to a corresponding digital activation signal for sourcing current when the digital activation signal is active and not sourcing current when the digital activation signal is inactive. Preferably each of the current sources includes a current sourcing transistor for sourcing current when switched on and at least one biasing transistor for receiving the corresponding digital activation signal, wherein the at least one biasing transistor causes the current sourcing transistor to turn on when the corresponding digital activation signal is active and the current sourcing transistor to turn off when the corresponding digital activation signal is inactive.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF PREFERRED EMBODIMENTS

Figure 1:
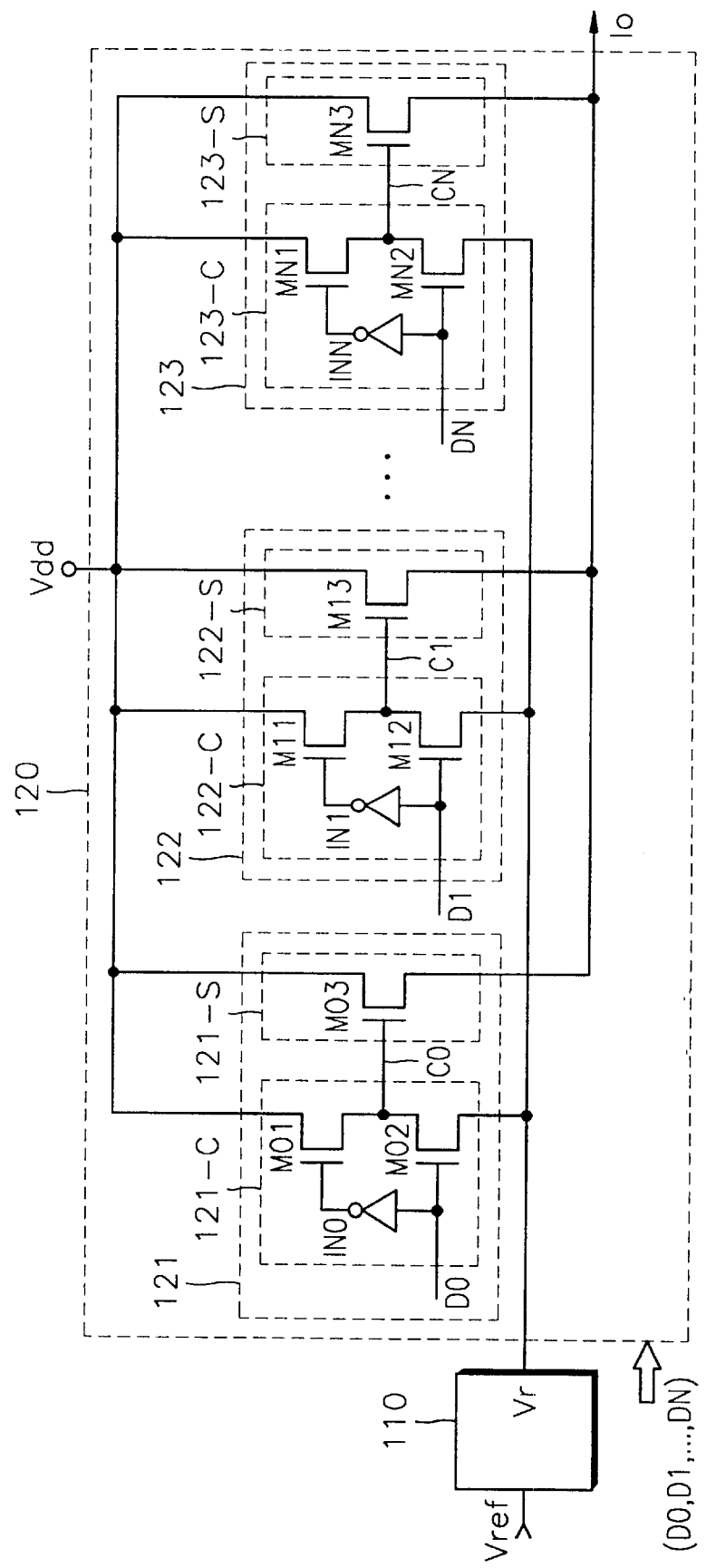
FIG. 1 is a circuit diagram of a digital to analog converter according to the present invention.
Figure 2:
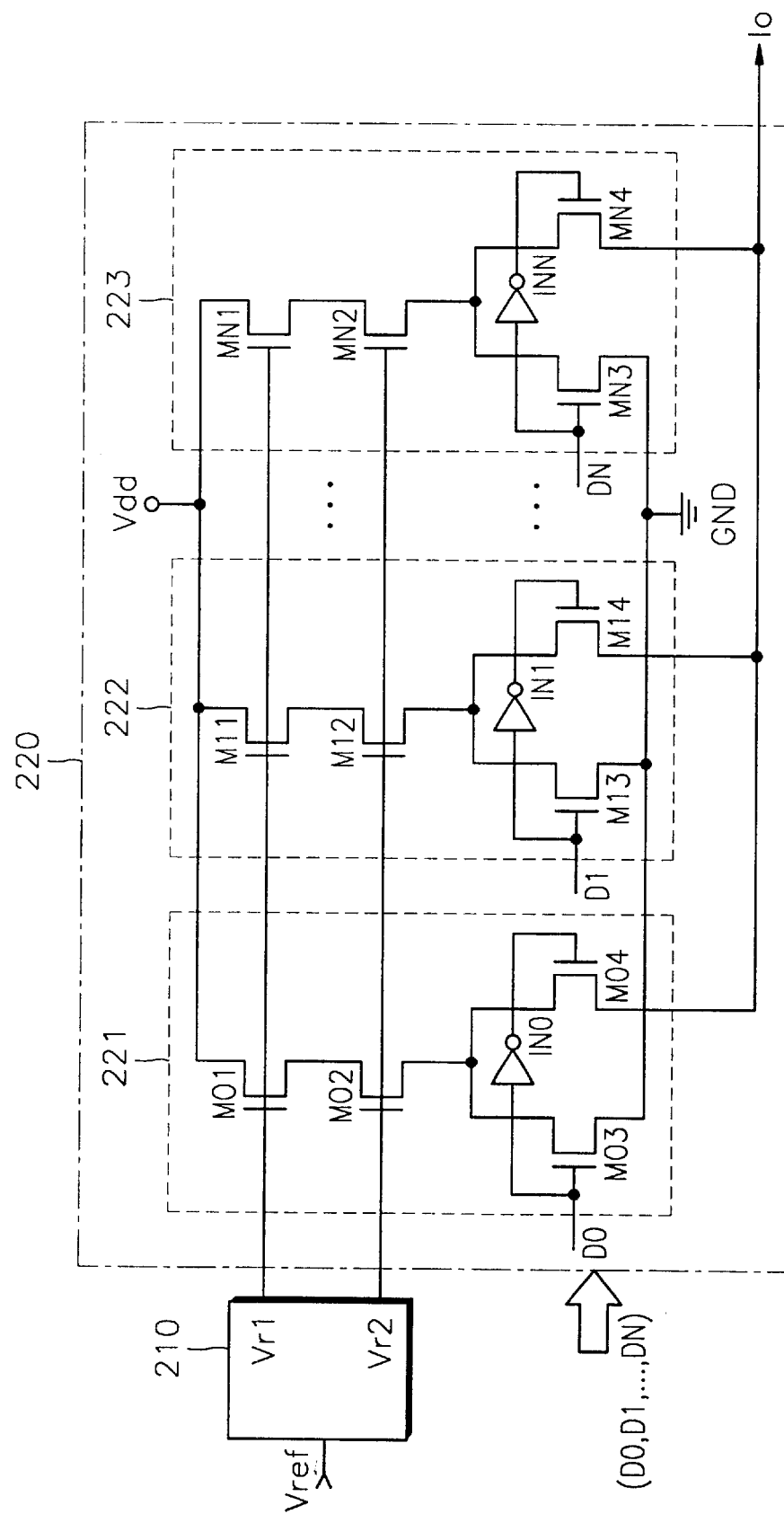
FIG. 2 is a circuit diagram illustrating an embodiment of a conventional digital to analog converter.
Figure 3:
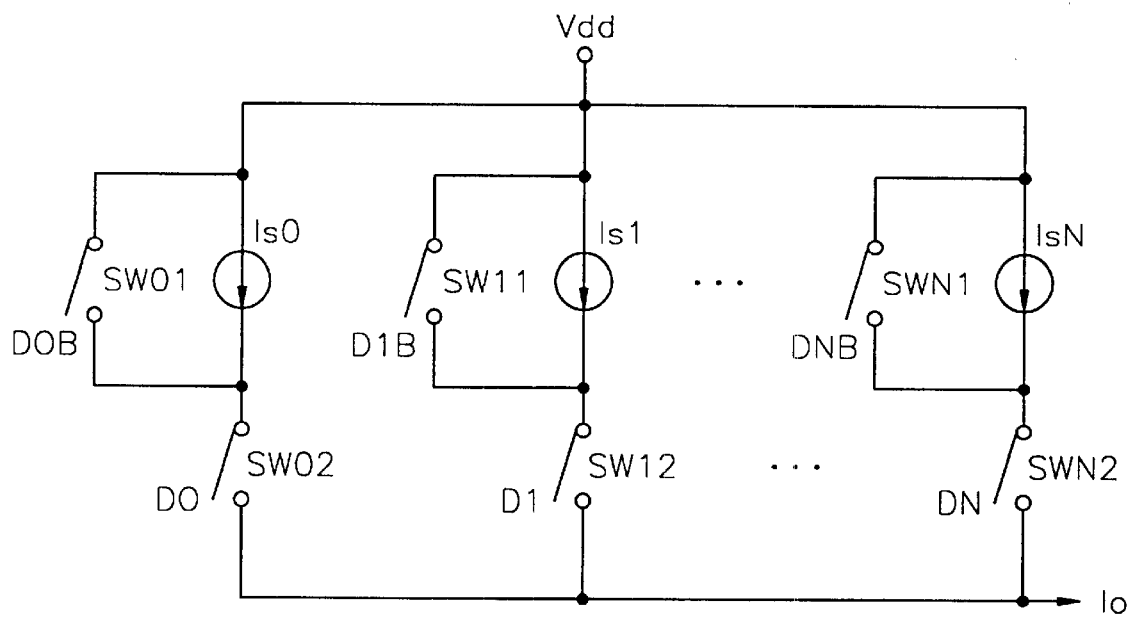
FIG. 3 is a simplified schematic diagram illustrating another conventional digital to analog converter.

The present invention will be described more fully hereinafter with reference to the accompanying drawings in which preferred embodiments of the invention are shown. Like reference numerals refer to like elements throughout the drawings.

FIG. 1 is a circuit diagram of a digital to analog converter according to a preferred embodiment of the present invention. As shown in FIG. 1, the digital to analog converter includes a reference bias voltage generator 110 and a conversion current generator 120.

The reference bias voltage generator 110 receives a reference voltage Vref and generates a predetermined bias voltage Vr. The conversion current generator 120 includes a plurality of current generators 121 through 123 for supplying current to an output terminal lo in response to the bias voltage Vr and a plurality of digital signals D0 through DN. The current generators which correspond to activated digital signals of the plurality of digital signals D0 through DN among the plurality of current generators 121 through 123 supply current to the output of terminal lo, but the other current generators which correspond to deactivated digital signals of the plurality of digital signals D0 through DN do not supply current to the output terminal lo.

A first current generator 121 includes a controller 121-C and a current source 121-S. The controller 121-C includes an inverter IN0, a first MOS transistor M01, and a second MOS transistor M02. The inverter IN0 inverts the digital signal D0. One end of the first MOS transistor M01 is connected to a power supply voltage Vdd, the other end thereof is connected to a control output terminal C0, and the gate thereof is connected to an output terminal of the inverter IN0. One end of the second MOS transistor M02 is connected to the control output terminal C0, the other end thereof is connected to the bias voltage Vr, and the gate thereof is connected to the digital signal D0.

The current source 121-S includes a third MOS transistor M03. One end of the third MOS transistor M03 is connected to the power supply voltage Vdd, the other end thereof is connected to the output terminal lo, and the gate thereof is connected to the control output terminal C0 of the controller 121-C.

A second current generator 122 includes a controller 122-C and a current source 122-S. The controller 122-C includes an inverter IN1, a fourth MOS transistor M11, and a fifth MOS transistor M12. The inverter IN1 inverts the digital signal D1. One end of the fourth MOS transistor M11 is connected to the Vdd, the other end thereof is connected to a control output terminal C1, and the gate thereof is connected to an output terminal of the inverter IN1. One end of the fifth MOS transistor M12 is connected to the control output terminal C1, the other end thereof is connected to the bias voltage Vr, and the gate thereof is connected to the digital signal D1.

The current source 122-S includes a sixth MOS transistor M13. One end of the sixth MOS transistor M13 is connected to Vdd, the other end thereof is connected to the output terminal lo, and the gate thereof is connected to the control output terminal C1 of the controller 122-C.

An N+1-th (where N is an integer) current generator 123 includes a controller 123-C and a current source 123-S. The controller 123-C includes an inverter INN, a seventh MOS transistor MN1, and an eighth MOS transistor MN2. The inverter INN inverts the digital signal DN. One end of the seventh MOS transistor MN1 is connected to the Vdd, the other end thereof is connected to a control output terminal CN, and the gate thereof is connected to an output terminal of the inverter INN. One end of the eighth MOS transistor MN2 is connected to the control output terminal CN, the other end thereof is connected to the bias voltage Vr, and the gate thereof is connected to the digital signal DN.

The current source 123-S includes a ninth MOS transistor MN3 of which one end is connected to the Vdd, of which the other end is connected to the lo, and of which gate is connected to the CN of the controller 123-C.

According to a preferred embodiment of the present invention, the amount of current supplied to the output terminal lo is varied by varying the ratio W/L of channel width W and channel length L of each of the MOS transistors M03 through MN3 in the current sources 121-S through 123-S.

Referring again to FIG. 1, in a case where the digital to analog converter receives activated digital signals from the plurality of digital signals, the digital to analog converter according to an embodiment of the present invention generates in the controller activated control signals which correspond to the activated digital signals, so corresponding current sources receiving the activated control signals switch on to supply current, and the sum of the current supplied by the plural current sources is supplied to the output terminal. On the other hand, in a case where the digital to analog converter receives deactivated digital signals from the plurality of digital signals, the digital to analog converter generates in the controller deactivated control signals which correspond to the deactivated digital signals, so corresponding current sources are deactivated and do not supply current with the unused current sources turned off as opposed to being shunted to ground, thereby reducing power consumption when digital signal is converted to analog signal.

Figure 4:
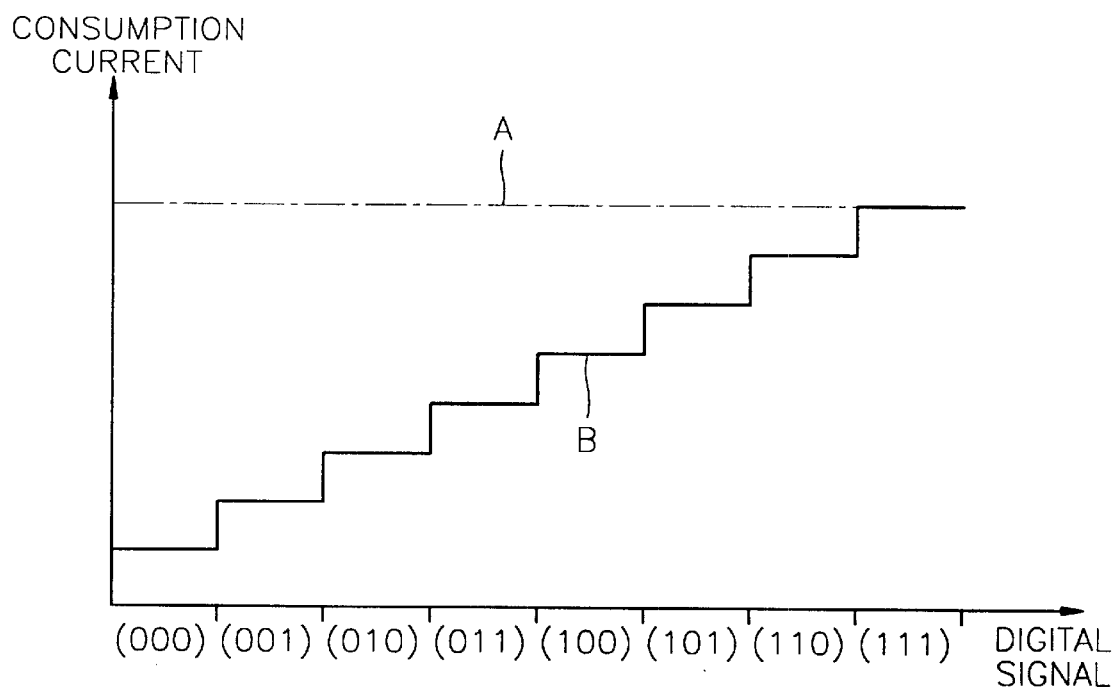
FIG. 4 illustrates the result in which a consumption current of the digital to analog converter according to the present invention is compared with that of the conventional digital to analog converter.

FIG. 4 is a graph showing consumption current of the digital to analog converter of the illustrative embodiment according to the present invention as compared with that of the conventional digital to analog converter with respect to a digital signal which increases in value from '000' to '111'. Referring to FIG. 4, consumption current which correspond to a 3-bit digital signal remain at a constant high value in the conventional digital to analog converter A, but in the illustrative digital to analog converter according to the present invention, when all 3 bits of the digital signal are low, the smallest consumption current flows. Also, the same amount of consumption current as that of the conventional digital to analog converter flows only if the consumption current is increased in response to the states of the 3 bits of the digital signal and all 3 bits of the digital signal are high.

As described above, the digital to analog converter according to the present invention controls currents supplied by current sources in response to the activation or deactivation of digital signals, thereby reducing current consumption.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A digital to analog converter comprising:
   a reference bias voltage generator for generating a predetermined bias voltage; and
   a conversion current generator comprising a plurality of current generators for supplying current to an output terminal when the bias voltage is applied and a plurality of activated digital signals are received;
   wherein the plurality of current generators which received the activated digital signals are activated to supply current to the output terminal, and current generators which receive deactivated digital signals of the plurality of digital signals do not supply current to the output terminal, and
   wherein the plurality of current generators are comprised of NMOS transistors.

2. The digital to analog converter according to claim 1, wherein each of the plurality of current generators comprises;
   a controller for generating a control signal in response to the bias voltage and at least one signal of the plurality of digital signals; and
   a current source for supplying current to the output terminal in response to the control signal.

3. The digital to analog converter according to claim 2, wherein the controller comprises;
   a control output terminal for outputting the control signal;
   an inverter for inverting the digital signal;
   a first NMOS transistor, one end of which is connected to a power supply voltage, the other end of which is connected to the control output terminal, and the gate of which is connected to an output terminal of the inverter; and
   a second NMOS transistor, one end of which is connected to the control output terminal, the other end of which is connected to the bias voltage, and the gate of which is connected to the digital signal.

4. The digital to analog converter according to claim 3, wherein one end of the current source is connected to the power supply voltage, the other end of the current source is connected to the output terminal, and the gate of the current source is connected to the control output terminal of the controller.

5. A digital to analog converter comprising:
   a bias voltage generator for generating a bias voltage; and
   a current generator having a plurality of current sources for providing current to an output node, each of the current sources being connected to the bias voltage generator and to a corresponding digital activation signal for sourcing current when the digital activation signal is active and not sourcing current when the digital activation signal is inactive, wherein the current generator is comprised of NMOS transistors.

6. The converter of claim 5, wherein each of the current sources includes a current sourcing transistor for sourcing current when switched on and at least one biasing transistor for receiving the corresponding digital activation signal, wherein the at least one biasing transistor causes the currant sourcing transistor to turn on when the corresponding digital activation signal is active and the current sourcing transistor to turn off when the corresponding digital activation signal is inactive.

* * * * *